US009643272B2

(12) United States Patent
Tang et al.

(10) Patent No.: US 9,643,272 B2
(45) Date of Patent: May 9, 2017

(54) ENCAPSULATION PROCESS ENABLING HOTBAR SOLDERING WITHOUT DIRECT PCB SUPPORT

(71) Applicant: Apple Inc., Cupertino, CA (US)

(72) Inventors: Chiu-Yu Tang, Pleasanton, CA (US);
Ibuki Kamei, San Jose, CA (US);
Timothy J. Rasmussen, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/460,296

(22) Filed: Aug. 14, 2014

(65) Prior Publication Data
US 2016/0050763 A1    Feb. 18, 2016

Related U.S. Application Data

(63) Continuation of application No. PCT/US2014/051122, filed on Aug. 14, 2014.

(51) Int. Cl.
*H01R 13/40* (2006.01)
*H05K 3/28* (2006.01)
(Continued)

(52) U.S. Cl.
CPC .............. *B23K 1/20* (2013.01); *B23K 1/0016* (2013.01); *B23K 3/0471* (2013.01); *H05K 3/284* (2013.01);
(Continued)

(58) Field of Classification Search
CPC ........ H05K 3/28; H01R 13/46; H01R 13/405; H01R 13/502
(Continued)

(56) References Cited

U.S. PATENT DOCUMENTS 6,752,649 B2 * 6/2004 Arkin ................... H01R 31/065
439/491
7,229,310 B1 * 6/2007 Brown ............... H01R 43/0263
361/760

(Continued)

FOREIGN PATENT DOCUMENTS

JP        2011100718        5/2011

OTHER PUBLICATIONS

PCT/US2014/051122 International Search Report & Written Opinion dated May 13, 2015.
International Preliminary Report and Written Opinion for PCT Application No. PCT/US2014051122 in 10 pages.

*Primary Examiner* — Eric Thomas
*Assistant Examiner* — Michael P McFadden
(74) *Attorney, Agent, or Firm* — Kilpatrick Townsend & Stockton LLP (57) ABSTRACT

A method for connecting or terminating wires to a printed circuit is disclosed. The method includes applying layers, such as a first layer and a second layer, to the printed circuit. The first layer is applied over several active components on the printed circuit, and provides a sealant against ingress of contaminants in the active components. The second layer is a rigid layer applied over the first layer. When the printed circuit is placed in a fixture, a metallic element, such as a thermode or hot bar, presses against the wires to hold the wires against several terminals on the printed circuit. The metallic element is heated to melt solder between the wires and the terminals. The second layer is configured to resist compressive forces from the metallic element and the fixture, such that the printed circuit and the active components are not damaged during the connection process.

20 Claims, 11 Drawing Sheets

(51) Int. Cl.
  *B23K 1/20* (2006.01)
  *B23K 1/00* (2006.01)
  *B23K 3/047* (2006.01)
  *H05K 3/34* (2006.01)

(52) U.S. Cl.
  CPC ............ *H05K 3/3494* (2013.01); *H05K 3/34* (2013.01); *H05K 2201/10287* (2013.01); *H05K 2203/1322* (2013.01); *H05K 2203/304* (2013.01)

(58) Field of Classification Search
  USPC ........................................................ 361/760
  See application file for complete search history.

(56) References Cited

U.S. PATENT DOCUMENTS

| | | | |
|---|---|---|---|
| 2003/0024723 A1* | 2/2003 | Igarashi | C08G 59/08 174/521 |
| 2010/0210142 A1* | 8/2010 | McGrath | H01R 12/594 439/620.22 |
| 2010/0238020 A1* | 9/2010 | Pellen | H01B 7/324 340/533 |
| 2012/0000703 A1 | 1/2012 | Kim et al. | |
| 2013/0175326 A1 | 7/2013 | Jol et al. | |
| 2013/0217253 A1 | 8/2013 | Golko et al. | |
| 2014/0073185 A1* | 3/2014 | Siahaan | H01R 13/504 439/607.58 |
| 2014/0227908 A1* | 8/2014 | Satoh | H01R 13/516 439/620.15 |

* cited by examiner

ENCAPSULATION PROCESS ENABLING HOTBAR SOLDERING WITHOUT DIRECT PCB SUPPORT

CROSS-REFERENCE TO RELATED APPLICATION

This application is a continuation of International Application No. PCT/US14/51122, with an international filing date of Aug. 14, 2014, entitled "ENCAPSULATION PROCESS ENABLING HOTBAR SOLDERING WITHOUT DIRECT PCB SUPPORT", which is incorporated herein by reference in its entirety.

FIELD

The described embodiments relate generally to soldering. In particular, the present embodiments relate to applying at least one protective layer over components in a device such that localized soldering may be performed without damaging the components and/or a substrate that receives the components.

BACKGROUND

Wire terminations and subsequent connections to a substrate (e.g., PCB) via soldering are generally known in the art. One method of soldering includes using a thermode, or "hot bar," that engages a wire to be connected to a substrate via solder. The hot bar is heated to a temperature which causes solder to melt or flow between or around the wire and substrate. Once the hot bar is either removed from the wire or cooled below the melting point of the solder, the solder forms an electrical and mechanical bond between the wire and the substrate. This method may be useful on large substrates performed in locations free of sensitive components.

However, the hot bar method of soldering is ineffective in instances where relatively small substrates are used. In order to hold a wire to be soldered on the substrate, the hot bar applies a force against the wire; at least some of the force is applied to the substrate, causing the substrate to warp. As a result, the substrate may become non-compliant with a structure (e.g., housing) that receives the substrate. Further, the force acting on the substrate may cause permanent damage to the substrate.

The force applied to the substrate can cause additional issues. For example, any components proximate to a surface of the substrate, including on a surface opposite the surface to be soldered, may be damaged. In addition to the force applied, liquid or chemicals (e.g., flux) used in the soldering process may engage the components and cause damage to the components. Accordingly, either the components, such as advanced components providing improved capabilities, may not be used with the cable assembly resulting in an inferior device, or the structure which houses the substrate cannot reduce its footprint resulting in an unnecessarily large structure.

SUMMARY

In one aspect, a method for connecting a wire to a printed circuit board (PCB) is described. The method may include applying a first layer to a first portion of the PCB. In some embodiments, the first layer is made from a first material and covers a component that is electrically connected to the PCB. The method may further include applying a second layer over the first layer. The second layer made from a second material different than the first material. Also, the second layer may be formed over the first layer such that the second layer includes a substantially level surface. The method may further include clamping, with a metallic element, the wire against a terminal on a second portion of the PCB. The second portion of the PCB may be directly opposite the first portion. The method may further include heating the metallic element to melt a solder element positioned between the wire and the terminal.

In another aspect, a connector is described. The connector may include a substrate having a first portion and a second portion opposite the first portion. The connector may further include several terminals positioned on the first portion; the several terminals may include a first terminal. The connector may further include several components positioned on the second portion; the several components may include a first component directly opposite the first terminal. The connector may further include a first layer covering the several components. In some cases, the first layer is configured to protect the several components from ingress of moisture. The connector may further include a second layer covering the first layer. In some embodiments, an outer peripheral portion of the second layer includes a substantially level surface. Also, in some embodiments, the second layer is free of compression during an assembly process of the connector.

In another aspect, a method for terminating a plurality of wires of a connector to a substrate is described. The method may include applying a first layer over a first portion of the substrate positioned within a housing of the connector. In some cases, the first layer may cover a plurality of components electronically connected to the substrate. The method may further include applying a second layer over the first layer. The second layer may be cured to form a substantially level surface. The method may further include placing the second layer against a fixture. The method may further include engaging the plurality of wires with a metallic element to hold the plurality of wires against a plurality of terminals positioned on a second portion of the substrate. The second portion is directly opposite the first portion. The plurality of wires may include a first wire and the plurality of terminals may include a first terminal. The method may further include melting a metallic material to bond the first wire to the first terminal In some cases, melting the metallic material includes heating the metallic element. Also, the second layer is free of compression between the metallic element and the fixture.

In another aspect, a machine-readable non-transitory storage medium storing instructions that, when executed by a processor included in a computing device, cause the computing device to carry out several steps. One step may include applying a first layer to a first portion of the printed circuit board (PCB). The first layer may be made from a first material. In some cases, the first layer covers a component electrically connected to the PCB. Another step may include applying a second layer over the first layer. The second layer may be made from a second material different than the first material. Also, the second layer may be formed over the first layer such that the second layer includes a substantially level surface. Another step may include clamping the wire against a terminal positioned on a second portion of the PCB with a metallic element. The second portion is opposite the first portion. Another step may include heating the metallic element to melt a solder element positioned between the wire and the terminal. In some cases, the metallic element holds the wire against the second side with a force. Also, in some cases, the second layer is free of compression between the metallic element and the fixture.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which:

FIG. 2 illustrates the embodiment of the cable assembly shown in FIG. 1, with the housing, the sheath member and the shroud member removed to show internal features of the cable assembly; FIG. 2 further shows a bottom view of the cable assembly and a substrate positioned within a portion of a connector;

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to a process for terminating (or connecting) wires to a substrate, which may include soldering the wires to a printed circuit board ("PCB") having terminals which receive the wires. In some cases, the wires are part of a cable assembly having a substrate positioned within a housing of the cable assembly. The substrate may include a surface having several components electrically connected to the substrate. One of the components may be, for example, an authentication chip on an integrated circuit ("IC") for authenticating a pair of electronic devices, both of which are electrically connected to the cable assembly. Alternatively, one of the components may be an analog circuit, or a battery monitor IC that monitors the battery power of an electronic device connected to the cable assembly.

Despite the functionality of the substrate, the surface of the substrate that receives these components may nonetheless include a relatively small surface area in order fit within a housing of the cable assembly. In some cases, the surface area is less than 0.5 square centimeters ("$cm^2$"), and in some cases, approximately 0.25 $cm^2$ or less. Further, the thickness of the substrate be approximately 1-2 millimeters ("mm") or less. Also, some components may be fragile and susceptible to damage during an assembly process, that is, when wires are electro-mechanically connected to the substrate. To terminate the wires on the terminals of the relatively small substrate without damaging the substrate and the components on the substrate, one or more layers of material may be applied to the substrate, and in particular, applied to the components. For example, a first layer may be configured to prevent ingress of contaminants, such as liquids or other forms of moisture. In some cases, a second layer may be applied over the first layer. The second layer may be formed from rigid material, or materials, and provide a flat or level surface to facility the assembly process.

To solder the wires to the substrate, the substrate may be placed within a fixture, with the level surface of the second layer engaged with the fixture. The wires may be positioned on terminals located on a surface directly opposite the surface having the components and the layers. A metallic element may be configured to hold the wires against the terminals. The metallic element may also be heated to a temperature capable of melting a solder element located on the wires and/or terminals. The metallic element may impose a force on the wires and the substrate which may be transferred to the first and second layers on the opposite surface. In addition, the fixture may impose an opposing, resistive force in the opposite direction. However, the second layer is formed from rigid materials sufficient to resist both forces thereby allowing the soldering process on the small substrate without damaging the substrate or the components.

These and other embodiments are discussed below with reference to FIGS. 1-14. However, those skilled in the art will readily appreciate that the detailed description given herein with respect to these Figures is for explanatory purposes only and should not be construed as limiting.

Figure 1:
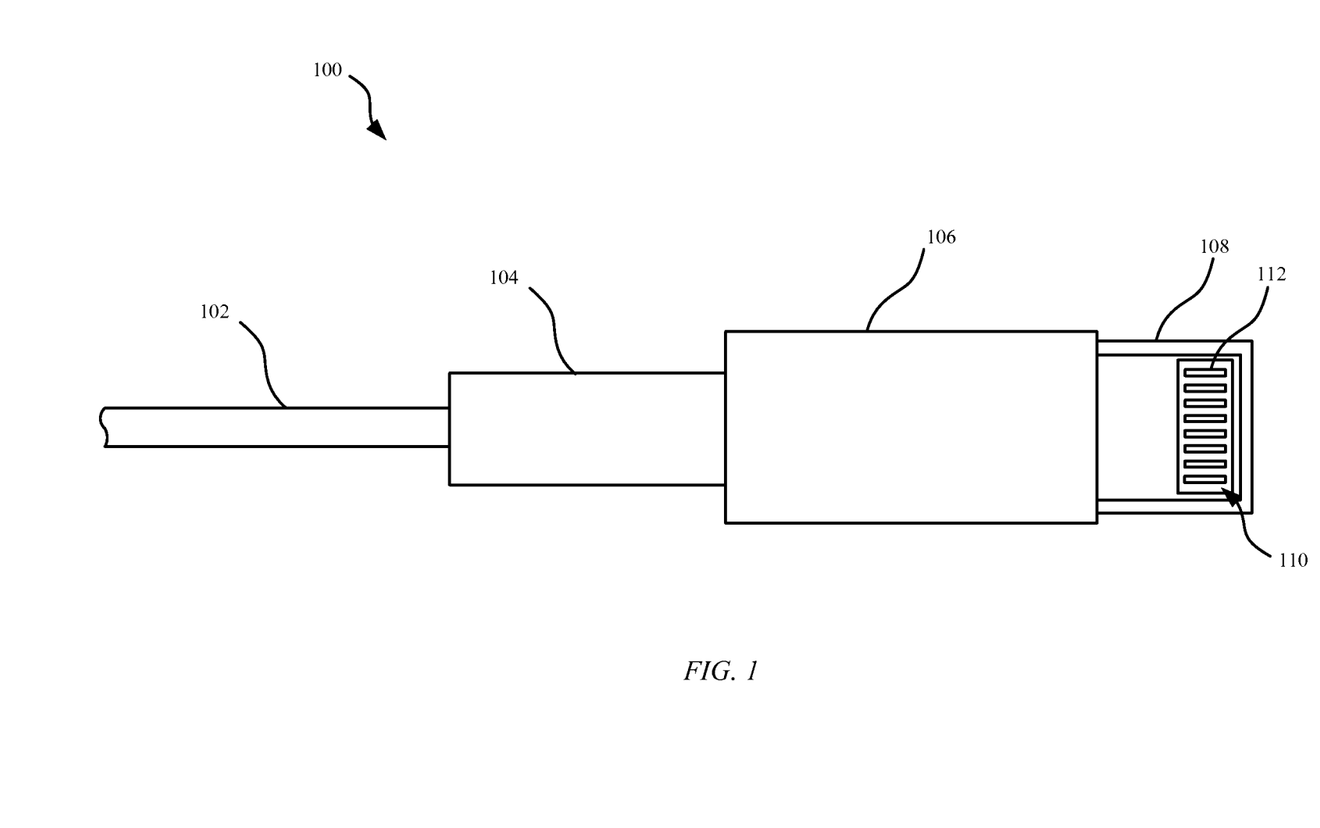
FIG. 1 illustrates an embodiment of a cable assembly.

FIG. 1 illustrates an embodiment of cable assembly 100. Cable assembly 100 may include sheath member 102 extending from shroud member 104. Sheath member 102 may include several wires (not shown) extending through sheath member 102 that may terminate to a connector (not shown). Sheath member 102 may be made from an electrically insulating material, such as a polymeric material, designed to bend or flex. Shroud member 104 may offer additional rigidity and support in a location where sheath member 102 engages housing 106. Housing 106 provides a cover for internal components (e.g., PCB, IC, etc.). Cable assembly 100 may also include connector 108 configured to engage an electronic device. Connector 108 may include several pins 110 configured to electrically connect cable assembly 100 to an electronic device, such as a portable electronic device (e.g., smartphone) or a tablet computing device. For example, first pin 112 may provide a pathway for electric current to enter the electronic device for purposes of charging, while second pin 114 may be configured to transmit data to and from the electronic device.

Figure 2:
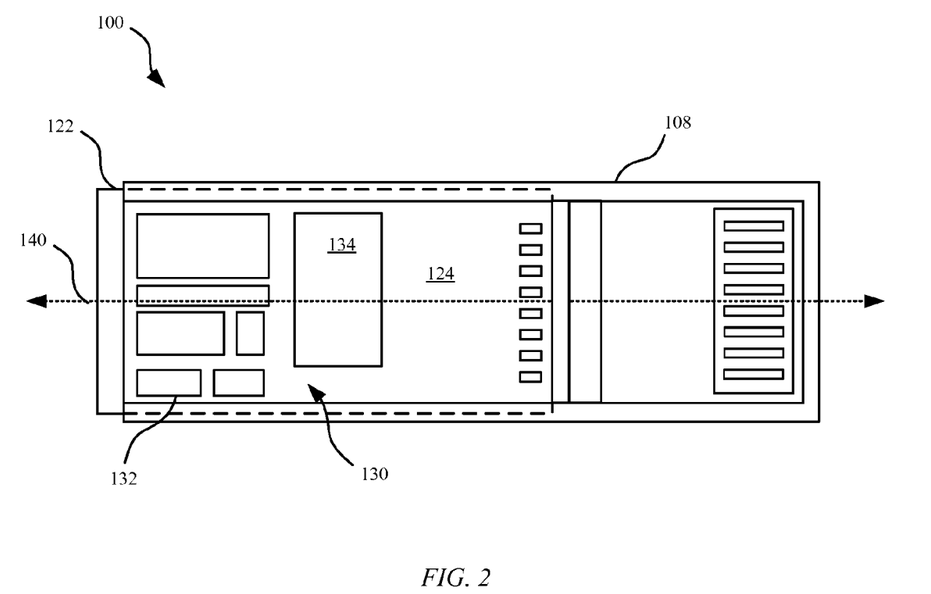
Figure 3:
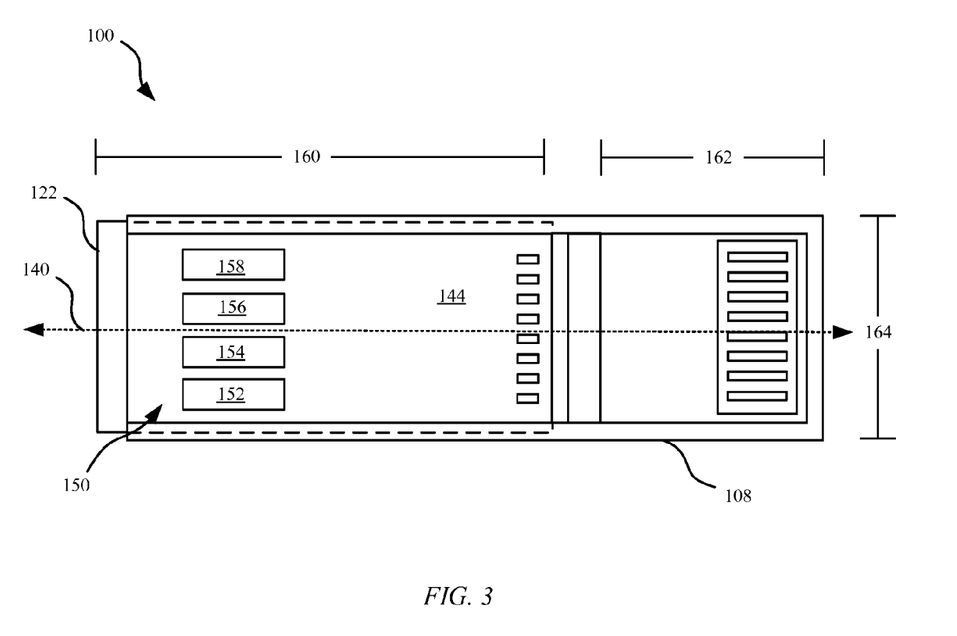
FIG. 3 illustrates the embodiment of the cable assembly shown in FIG. 2, rotated 180 degrees about a longitudinal axis to show a top view (opposite the bottom view)

FIGS. 2 and 3 illustrate the embodiment of cable assembly 100 shown in FIG. 1, with the housing, the sheath member and the shroud member removed to show internal features of cable assembly 100. FIG. 2 illustrates a bottom view of cable assembly 100 showing substrate 122 positioned within a portion of connector 108. In some embodiments, substrate 122 is made from PCB configured to electrically connect several ICs and other discrete components to each other as well as other external devices. Substrate 122 may include first portion 124 having several components 130 positioned on first portion 124. For example, first portion 124 may include first component 132 and second component 134. First component 132 and/or second component 134 may be selected from, but not limited to, an IC configured to allow electronic devices to perform a "handshake," digital logic block, an analog circuit, or a series of ICs configured to perform several operations (e.g., send or receive a signal) over a relatively few number of pins, such as second pin 114. While the embodiment shown in FIG. 2 shows seven components, in some embodiments, first portion 124 of substrate 122 includes eight or more components. Alternatively, in other embodiments, first portion 124 of substrate 122 includes one to six components. Also, substrate 122 includes contacts 136 corresponding to pins 110. Contacts 136 provide an electrical contact from substrate 122 to pins 110.

FIG. 3 illustrates the embodiment of cable assembly 100 shown in FIG. 2, rotated 180 degrees about a longitudinal axis 140 show a top view (opposite the bottom view). Substrate 122 may include second portion 144 directly opposite first portion 124 (shown in FIG. 2). Second portion 144 may include terminals 150 that provide a termination point for wires (not shown) of cable assembly 100, and further electrically connect the wires to substrate 122. Terminals 150 may be located on second portion 144 in a location directly opposite components 130 (shown in FIG. 2) on first portion 124. Terminals 150 may be formed from electrically conductive materials (e.g., metal, brass, gold, etc.). In the embodiment shown in FIG. 3, terminals 150 include four terminals, including first terminal 152, second terminal 154, third terminal 156, and fourth terminal 158. However, in other embodiments, terminals 150 could include one to three terminals. Still, in other embodiments, terminals 150 could include five or more terminals. Generally, the number of terminals corresponds to the number of wires needed for cable assembly 100.

FIG. 3 further shows the dimensions of connector 108 and substrate 122. For example, substrate 122 includes length 160 approximately in the range of 7 to 13 mm. Also, a portion of connector 108 visible when the housing is not removed includes length 162 and width 164, both of which are approximately in the range of 4 to 6 mm. It will be appreciated that the width of substrate 122 is less than the width of connector 108.

Figure 4:
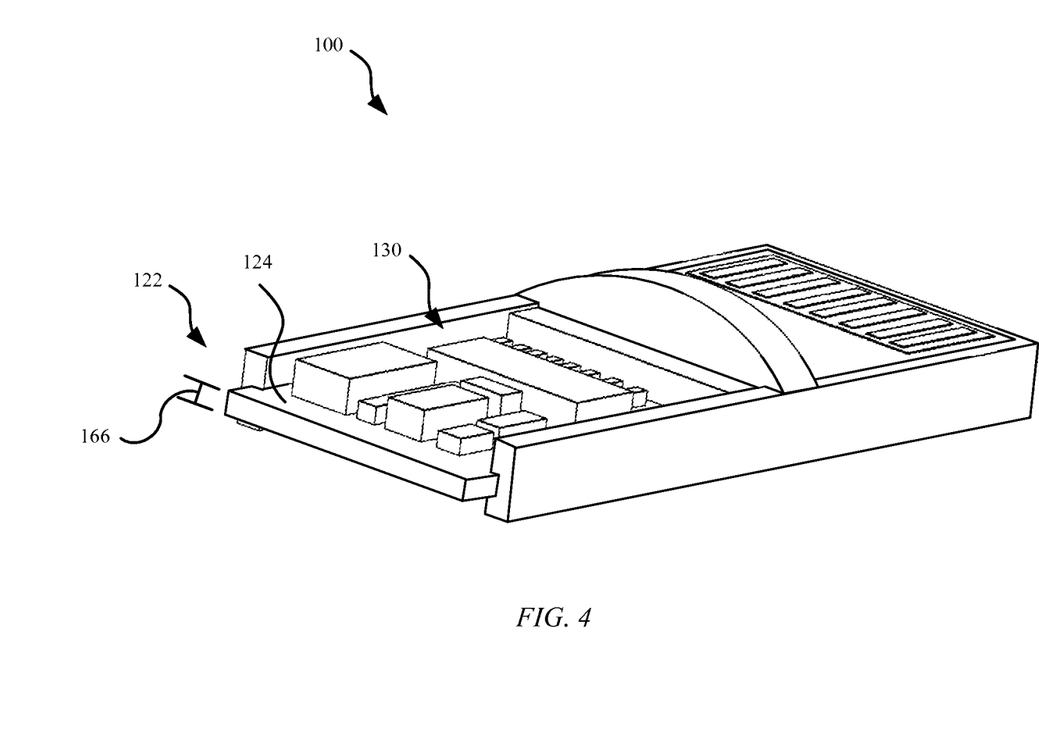
FIG. 4 illustrates an isometric view of the embodiment of the cable assembly shown in FIG. 2, further showing several components on a first portion of the substrate.

FIG. 4 illustrates an isometric view of the embodiment of cable assembly 100 shown in FIG. 2, further showing components 130 on first portion 124 of substrate 122. Also, substrate 122 includes thickness 166 approximately in the range of 0.5 to 1 mm. As a result these relatively small dimensions, assembly processes performed on substrate 122, such as connecting wires to terminals 150 (shown in FIG. 3) may cause a force on substrate 122 sufficient to damage or break substrate 122. In some cases, the force on substrate 122 may cause substrate 122 to warp, in which case substrate 122 may no longer be compliant with a housing (e.g., housing 106). Also, in cases where substrate 122 includes components 130 that are fragile, forces imposed by assembly processes performed on the second portion of substrate 122 may be transferred to components 130 thereby causing damage to components 130, resulting in a non-functioning cable assembly.

Figure 5:
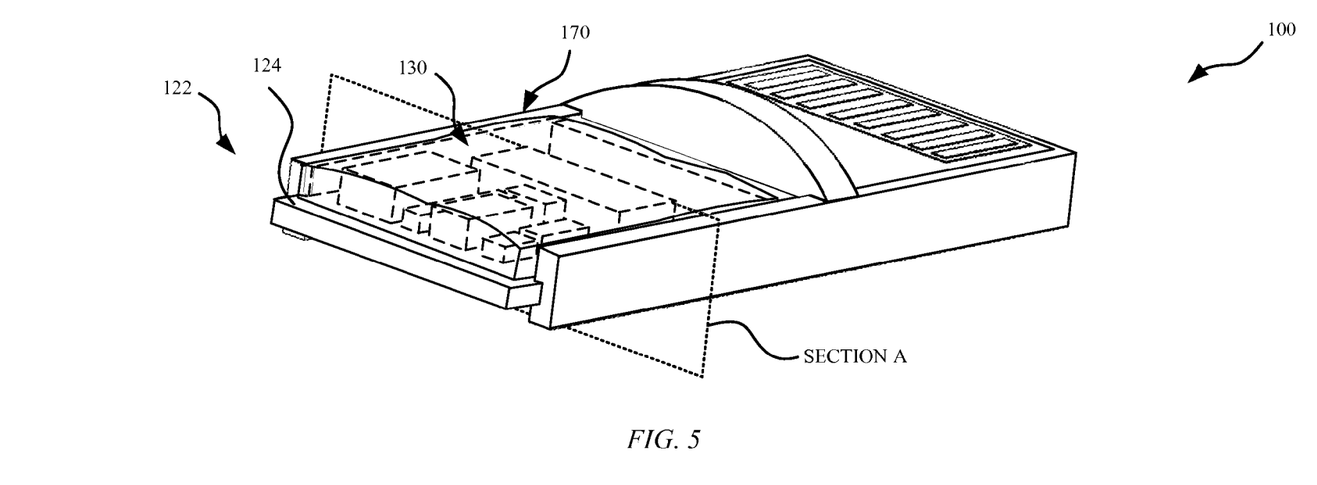
FIG. 5 illustrates an isometric view of a cable assembly having a first layer applied over several components positioned on a first portion of a substrate.
Figure 6:
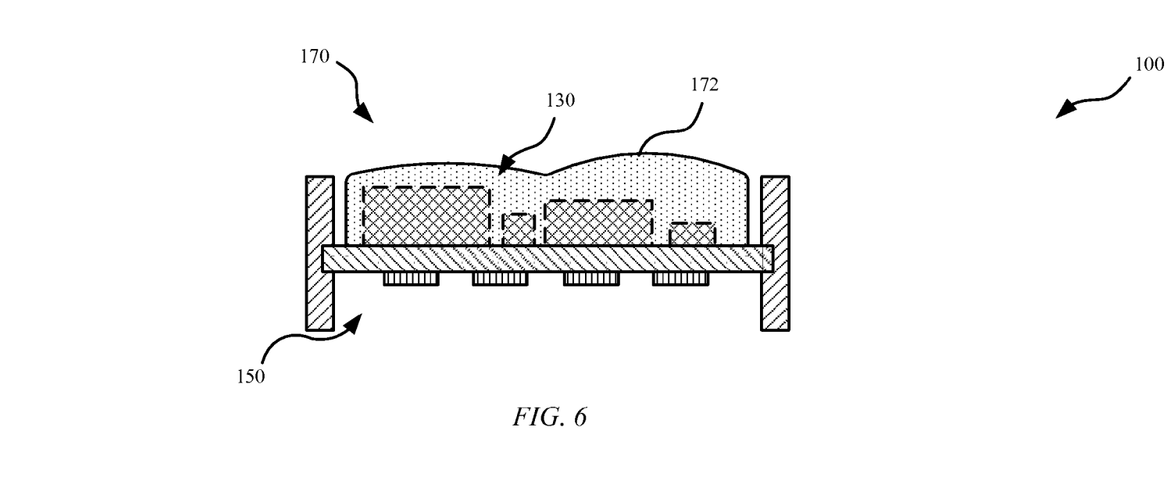
FIG. 6 illustrates a cross sectional view of the cable assembly taken along the two-dimensional feature shown as Section A in FIG. 5, showing the first layer applied over several components, in accordance with the described embodiments.

In this regard, a protective element may be applied to components in order to withstand at least some forces associated with an assembly process. For example, FIGS. 5 and 6 illustrate an embodiment of cable assembly 100 having several components 130 on first portion 124 of substrate 122. FIG. 5 illustrates an isometric view of cable assembly 100 having first layer applied over components 130 and first portion 124. First layer 170 is configured to form a sealant against ingress from liquid or moisture in order to prevent damage to substrate 122 and components. First layer 170 may provide some resistance to forces associated with assembly processes of cable assembly 100. In some embodiments, first layer 170 is formed from acrylic. In some embodiments, first layer 170 includes acrylate. Further, in some embodiments, first layer 170 is formed from LOCTITE® Eccobond UV9060F UV encapsulant from Henkel Corp., of Düsseldorf, Germany. In other embodiments, first layer 170 is made from Hysol UV9060F from Henkel Corp., of Düsseldorf, Germany. Generally, first layer 170 may be made from any material or materials known in the art for potting a circuit board enclosed in a housing. Also, first layer 170 may be applied to first portion 124 by several methods. For example, a print head from printing machine, including a three-dimensional printer, may be configured to release first layer 170 over first portion 124. Alternatively, first layer 170 may be molded over components 130 by a mold member (not shown) used as part of an injection molding process.

First layer 170 may be cured by UV and/or visible light. However, during the curing process, first layer 170 may form a non-linear surface. For example, FIG. 6 shows a cross sectional view of cable assembly 100 taken along the two-dimensional feature shown as Section A in FIG. 5, showing first layer 170 applied over components 130. First layer 170 also includes non-linear portion 172. Non-linear portion 172 may be any non-flat surface formed from the curing process. While first layer 170 may be sufficient to provide protection to substrate 122 and/or components 130 during an assembly process, non-linear portion 172 may be undesirable in some instances. For example, in order to connect wires to substrate 122 via terminals 150, cable assembly 100 may be positioned within a fixture having a flat surface. However, if cable assembly 100 is placed on the fixture with non-linear portion 172 engaging the fixture, cable assembly 100 will not lie flat or level. Accordingly, in some cases, the machinery may need additional adjustments to compensate.

Figure 7:
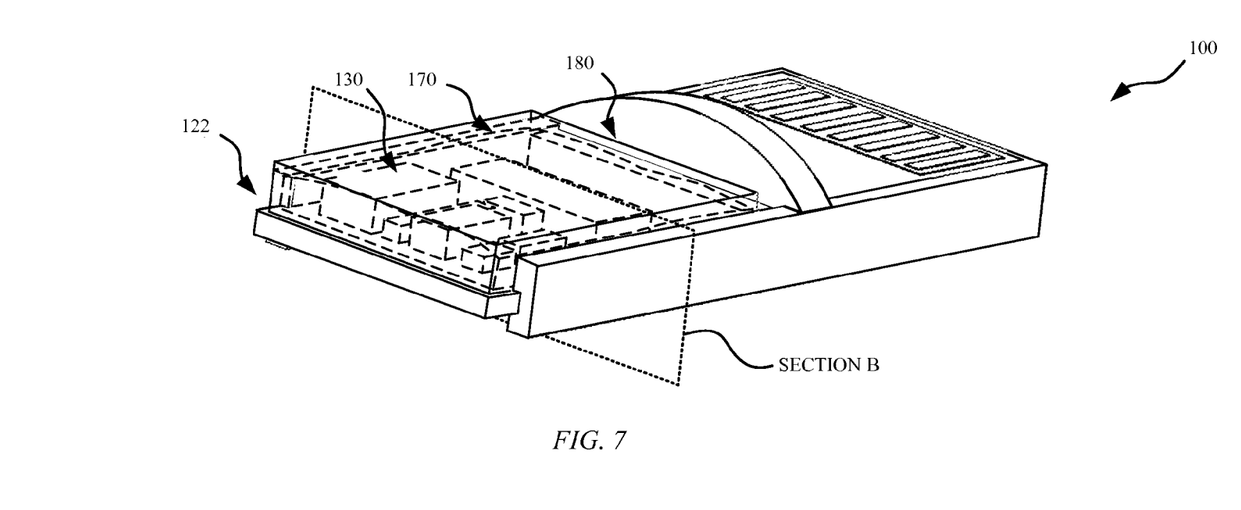
FIG. 7 shows an isometric view of an embodiment of a cable assembly having a second layer applied over a first layer.
Figure 8:
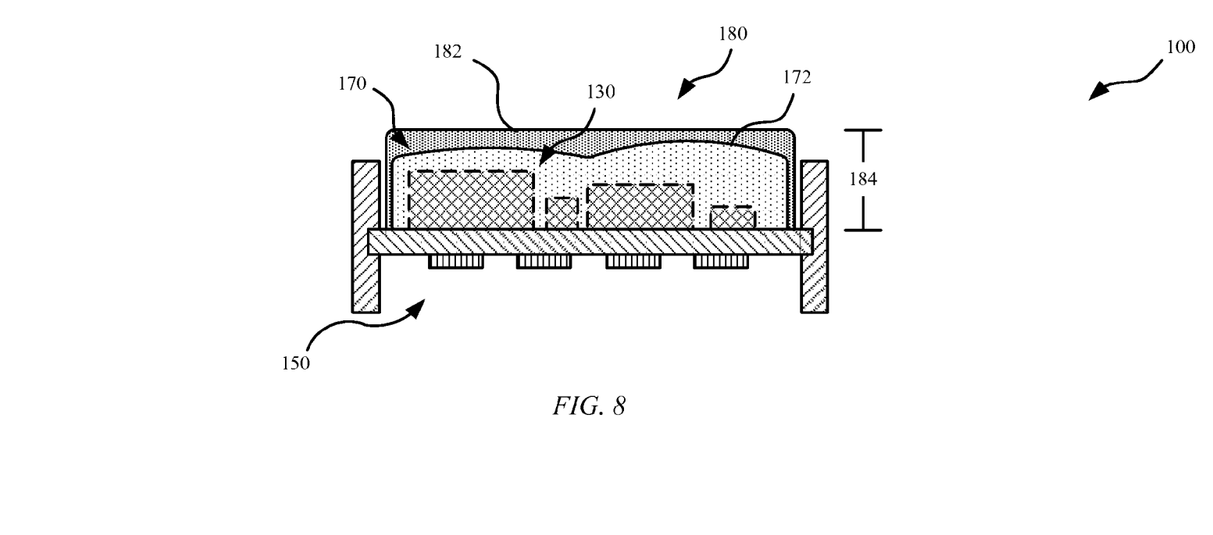
FIG. 8 illustrates a cross sectional view of the cable assembly taken along the two-dimensional feature shown as Section B in FIG. 7, showing a second layer applied over a first layer, in accordance with the described embodiments.

However, in some embodiments, an additional layer may be applied to first layer 170 in order to form a flat or level surface. FIGS. 7 and 8 illustrate an embodiment of cable assembly 100 having second layer 180 applied over first layer 170. FIG. 7 shows an isometric view of cable assembly 100 having second layer 180 applied over first layer 170. Second layer 180 may be formed from materials such as ethylene vinyl acetate ("EVA") polyurethane, polyamides, metallocene polyalphaolefins, or a combination thereof. Further, in some embodiments, second layer 180 is formed from Macromelt® from Henkel Corp., of Düsseldorf, Germany. In other embodiments, second layer 180 is made from Technomelt, including Technomelt Supra™ or Technomelt Extra™, from Henkel Corp., of Düsseldorf, Germany Generally, second layer 180 is made from rigid materials, including adhesives, such that second layer 180 is not compressed during assembly processes of cable assembly 100. In other words, second layer 180 can resist deformation which provides a dimension of protection to substrate 122 and components 130. In addition, second layer 180 is capable curing at relatively low temperatures (e.g., 200 degrees Celsius or less) and low pressure. In this manner, second layer 180 will not be heated sufficiently as to allow certain metals, such as solder, to melt or reflow. Also, second layer 180 may be applied to substrate 122 in any manner previously described for first layer 170.

FIG. 8 illustrates a cross sectional view of cable assembly 100 taken along the two-dimensional feature shown as Section B in FIG. 7, showing second layer 180 applied over first layer 170. When second layer 180 is cured, second layer 180 may include linear portion 182 which is generally flat or level, regardless of the dimensions of non-linear portion 172. In this manner, cable assembly 100 may be placed in the fixture previously described, with linear portion 182 providing a level or flat surface to facilitate the assembly process. Also, second layer 180 includes thickness 184 that remains constant during the assembly process of cable assembly 100 (discussed below).

Figure 9:
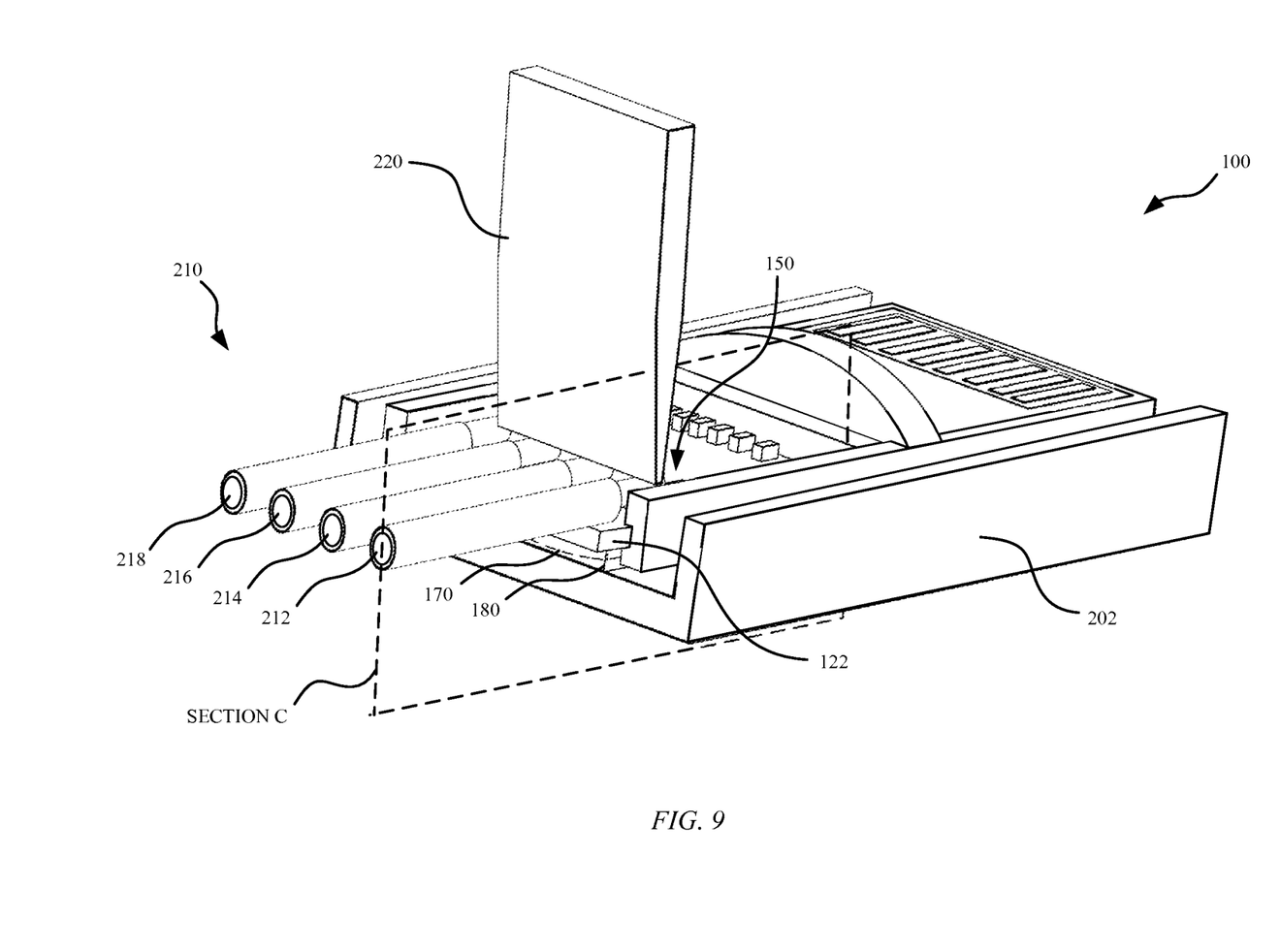
FIG. 9 illustrates an isometric view of an assembly process of the cable assembly having a first layer and a second layer.

FIG. 9 illustrates an isometric view of an assembly process of cable assembly 100 having first layer 170 and second layer 180 (shown in FIGS. 7 and 8). Cable assembly 100 may be positioned in fixture 202 to facilitate the assembly process. The assembly process may include connecting several wires 210 to substrate 122 via metallic element 220 and solder (not shown). The assembly process may include metallic element 220, which, as shown, is capable of engaging and holding, or clamping, in place first wire 212, second wire 214, third wire 216, and fourth wire 218 against first terminal 152, second terminal 154, third terminal 156, and fourth terminal 158, respectively (terminals are shown in FIG. 3). Generally, metallic element 220 is made of metal or a metal alloy capable of heat transfer. In some embodiments, metallic element 220 is a thermode, or hot bar, that is part of a tool which heats metallic element 220 to a temperature which melts the solder thereby electrically and mechanically connecting wires 210 to substrate 122 via terminals 150. Heating means may include applying electrical current through metallic element 220 to produce electrical resistance thereby generating heat. Further, heat may be removed from metallic element 220 to solidify the solder. Alternatively, metallic element 220 may be cooled to facilitate solidifying the solder.

Figure 10:
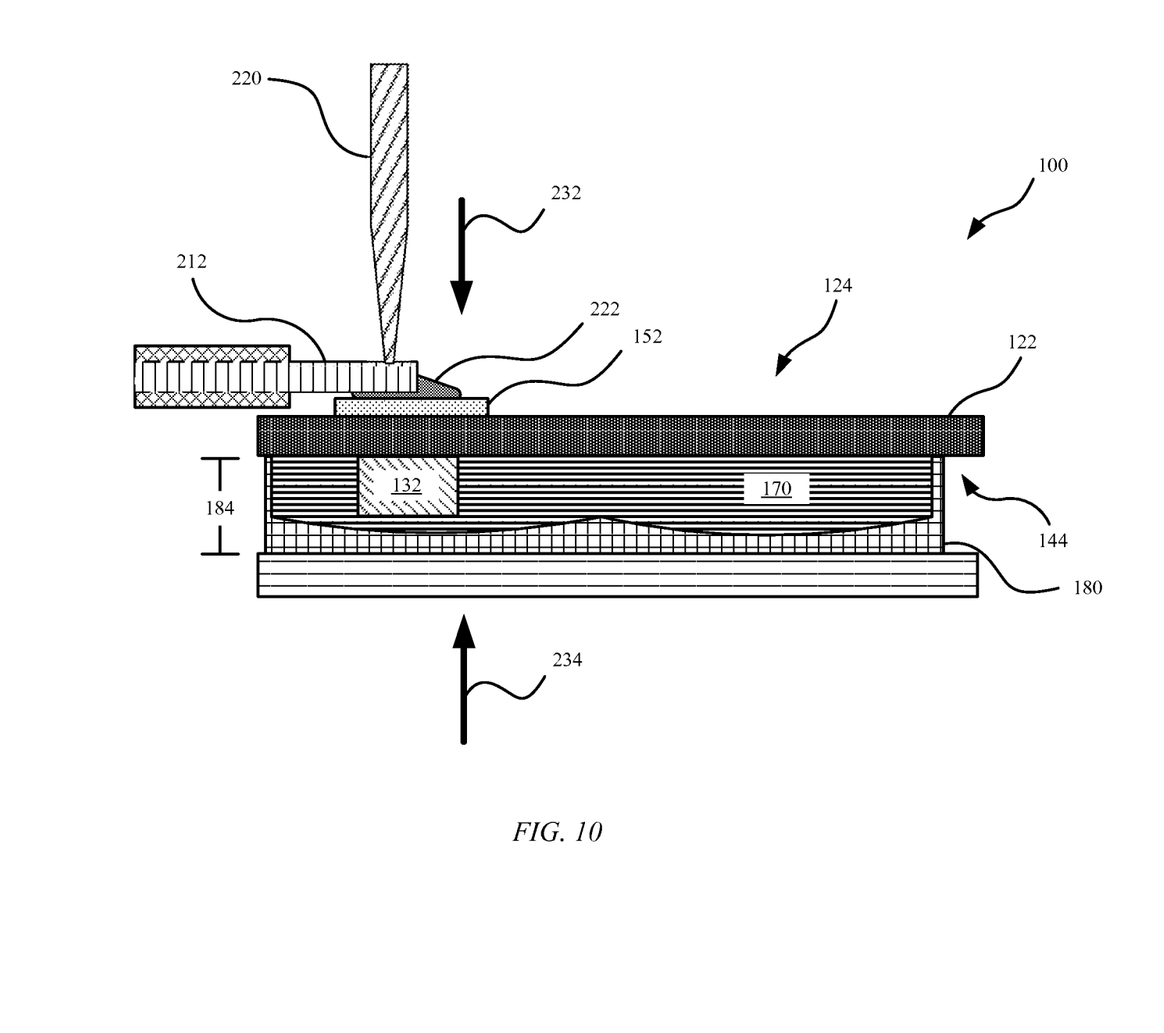
FIG. 10 illustrates a cross sectional view of the cable assembly taken along the two-dimensional feature shown as Section C in FIG. 9, showing a first wire held between a metallic element and a solder element in order to solder the first wire to a first terminal.

FIG. 10 illustrates a cross sectional view of cable assembly 100 taken along the two-dimensional feature shown as Section C in FIG. 9, showing an exemplary first wire 212 held between metallic element 220 and solder element 222 in order to solder first wire 212 to first terminal 152. It will be appreciated that the remaining wires and terminals include a similar configuration (i.e., wires are between metallic element 220 and respective solder elements). In this configuration, metallic element 220 may apply a first force 232 to first wire 212 in order to maintain first wire 212 in place. First force 232 is designated as an arrow pointing to a direction toward first portion 124 of substrate 122. However, in order to offset, or counteract, first force 232 and the force (weight) of cable assembly 100, fixture 202 may apply a second force 234 designated as an arrow pointing in a direction toward second portion 144 of substrate 122. Generally, first force 232 and second force 234 are opposing forces. As a result, substrate 122 may undergo additional stress. However, second layer 180 is configured to resist first force 232 and second force 234. In other words, second layer 180 does not compress during the described assembly process, as second layer 180 retains the same thickness 184 prior to the assembly process. Accordingly, substrate 122 and first component 132 are not damaged during the assembly process, despite their relatively small dimensions.

In some embodiments, cable assembly 100 may include only second layer 180, that is, the materials described to form second layer 180. In other words, in some embodiments, first layer 170 is not applied to cable assembly 100.

Figure 11:
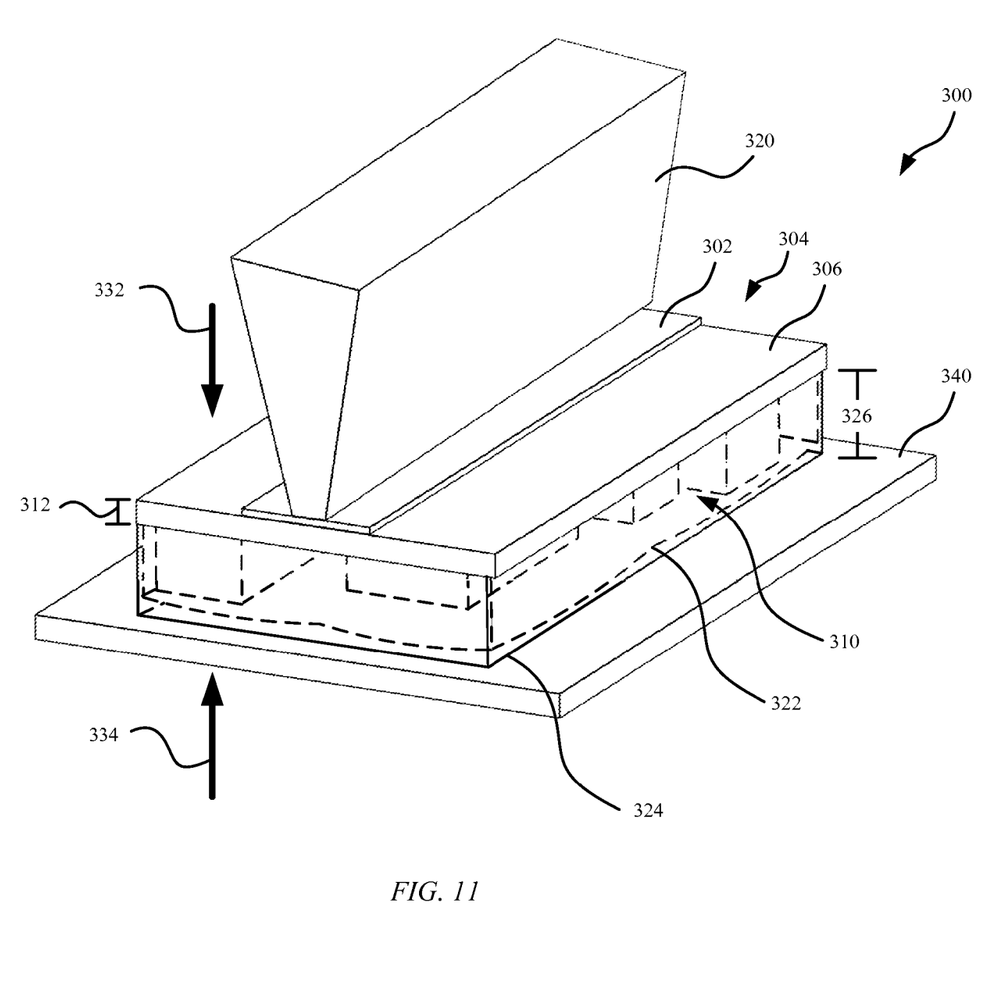
FIG. 11 illustrates an isometric view of an enlarged portion of an electronic device undergoing an assembly process including a portion of a flexible circuit electromechanically connected to a substrate, in accordance with the described embodiments.

While the described embodiments include methods for connecting wires to a connector to form a cable assembly, this process may be applied to other electronic devices. For example, FIG. 11 illustrates an isometric view of an enlarged portion of electronic device 300 undergoing an assembly process including a portion of flexible circuit 302 electromechanically connected to substrate 304. Electronic device 300 may be selected from a portable electronic device, a desktop computing device, or a tablet computing device. In some embodiments, flexible circuit 302 is configured to carry an electrical signal to and from components within, for example, a keyboard or a display panel, of electronic device 300. Also, in some embodiments, substrate 304 is a PCB. Flexible circuit 302 may include a bottom portion having a solder engaged with a first portion 306 of substrate 304. The assembly process may further include metallic element 320. Metallic element 320 may be part of a tool which heats metallic element 320 to a temperature which melts the solder thereby electrically and mechanically connecting flexible circuit 302 to substrate 304.

Substrate 304 may include several components 310 on a second portion opposite first portion 306. Components 310 may include any components previously described for components 130. Accordingly, components 310 may be fragile and susceptible to damage during the assembly process. Also, substrate 304 may include thickness 312 approximately in the range 0.5 to 2 mm, which may be insufficient to withstand a force generated by metallic element 320 on flexible circuit 302 and substrate 304. In other words, substrate 304 may become warped or damaged during the assembly process without further reinforcement.

In order to withstand damage during assembly, the second portion of substrate 302 may be coated with first layer 322 and second layer 324. First layer 322 may include any material or combination of materials previously described for first layer 170 (shown, for example, in FIGS. 5 and 6). Also, second layer 324 may include any material or combination of materials previously described for second layer 180 (shown, for example, in FIGS. 7 and 8). Accordingly, at least second layer 324 may be sufficiently rigid to withstand first force 332 generated by metallic element 230 as well as an opposing second force 334 generated by fixture 340 in order to offset first force 332 and the force (weight) of cable assembly 300. As such, second layer 324 maintains thickness 236 throughout the assembly process, and neither substrate 302 nor components 310 are damaged.

Figure 12:
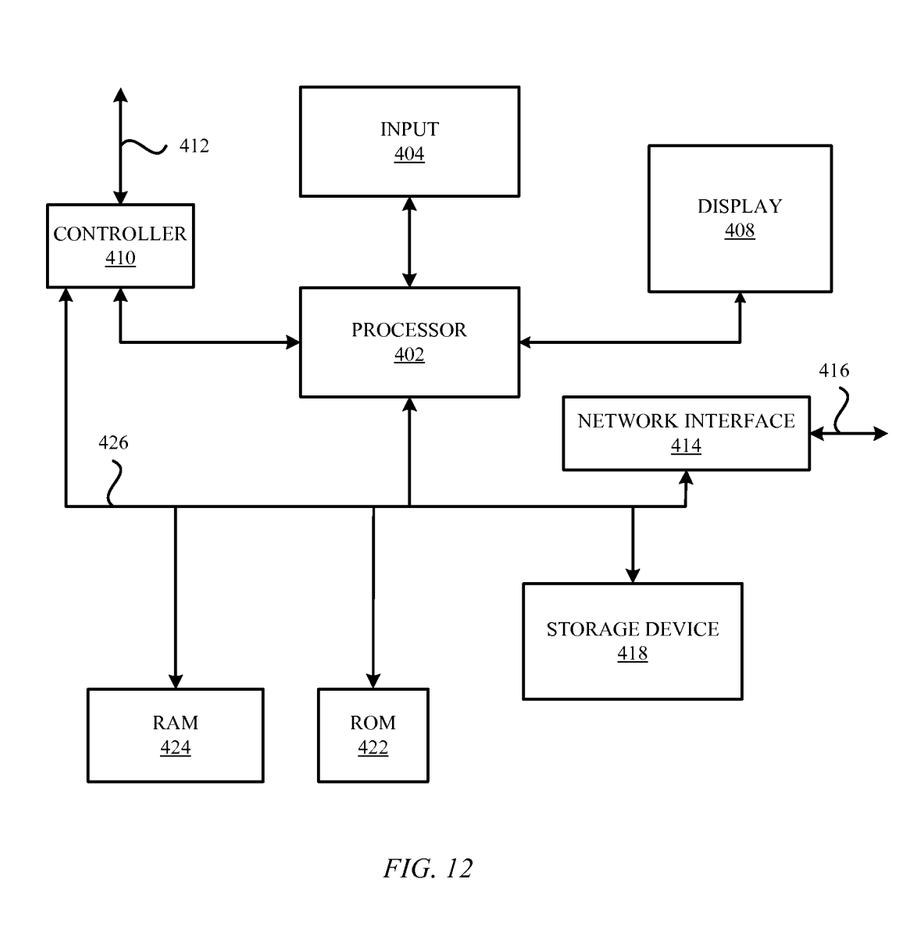
FIG. 12 illustrates a block diagram of a computing device that can represent the components of the various embodiments discussed herein.

FIG. 12 illustrates a block diagram of computing device 400 that can represent the components of the various embodiments discussed herein. It will be appreciated that the components, devices or elements illustrated in and described with respect to FIG. 12 may not be mandatory and thus some may be omitted in certain embodiments. Computing device 400 can include processor 402 that represents a microprocessor, a coprocessor, circuitry and/or a controller for controlling the overall operation of computing device 400. Although illustrated as a single processor, it can be appreciated that the processor 400 can include a plurality of processors. The plurality of processors can be in operative communication with each other and can be collectively configured to perform one or more functionalities of the computing device 400 as described herein. In some embodiments, processor 402 can be configured to execute instructions that can be stored at the computing device 400 and/or that can be otherwise accessible to the processor 402. As such, whether configured by hardware or by a combination of hardware and software, the processor 402 can be capable of performing operations and actions in accordance with embodiments described herein.

Computing device 400 can also include user input device 404 that allows a user of the computing device 400 to interact with the computing device 400. For example, user input device 402 can take a variety of forms, such as a button, keypad, dial, touch screen, audio input interface, visual/image capture input interface, input in the form of sensor data, etc. Still further, computing device 400 can include display 408 (e.g., screen display) that can be controlled by processor 402 to display information to a user. Controller 410 can be used to interface with and control different equipment through equipment control bus 412. Computing device 400 can also include network/bus interface 414 that couples to data link 416. Data link 416 can allow computing device 400 to couple to a host computer or to accessory devices. Data link 416 can be provided over a wired connection or a wireless connection. In the case of a wireless connection, network/bus interface 414 can include a wireless transceiver.

Computer device 400 can also include storage device 418, which can have a single disk or several disks (e.g., hard drives) and a storage management module that manages one or more partitions (also referred to herein as "logical volumes") within storage device 418. In some embodiments, storage device 418 can include flash memory, semiconductor (solid state) memory or the like. Still further, computing device 400 can include Read-Only Memory ("ROM") 422 and Random Access Memory ("RAM") 424. ROM 422 can store programs, code, instructions, utilities or processes to be executed in a non-volatile manner. RAM 424 can provide volatile data storage, and stores instructions related to components of the storage management module that are configured to carry out the various techniques described herein. The computing device can further include data bus 426. Data bus 426 can facilitate data and signal transfer between at least processor 402, controller 410, network interface 414, storage device 418, ROM 422, and RAM 424.

Figure 13:
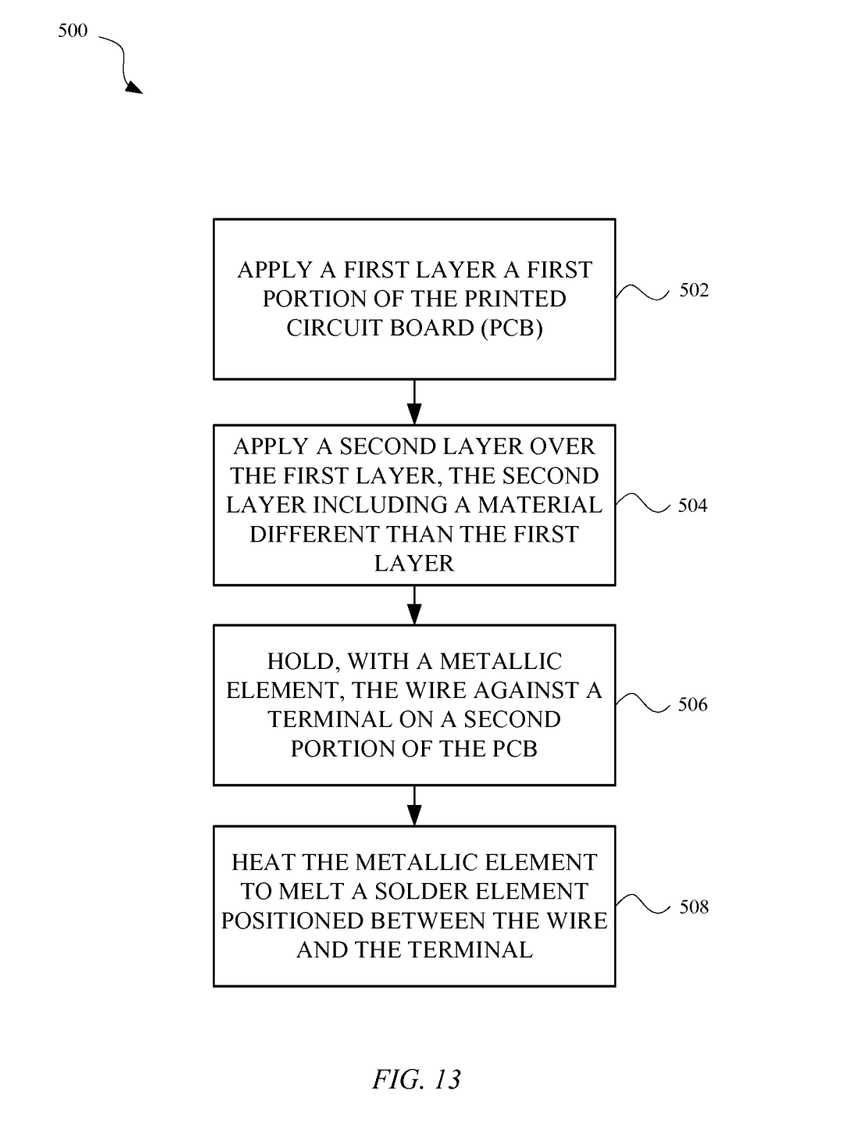
FIG. 13 illustrates a flowchart showing a method for connecting a wire to a printed circuit board (PCB)

FIG. 13 illustrates a flowchart 500 showing a method for connecting a wire to a printed circuit board (PCB). In step 502, a first layer is applied to a first portion of the PCB. In some embodiments, the PCB includes a component electrically connected to the PCB. In some embodiments, the first layer includes a UV encapsulant that protects a component from ingress of liquids or moisture. In step 504, a second layer is applied over the first layer. In some embodiments, the second layer is made from a rigid material configured to resist compression during an assembly process. Also, in some embodiments, the second layer may be cured to include a substantially flat or level surface regardless of whether the first layer on which second layer is applied includes any non-linear surface. In step 506, the wire is held in place with a metallic element against a terminal located on a second portion of the PCB. The second portion is opposite the first portion. In step 508, the metallic element is heated to melt a solder element positioned between the wire and the terminal.

In some cases, the metallic element may hold the wire in place with a force. Also, the fixture may impose a second force in the opposite direction as the force imposed by the metallic element. However, the second layer is does not compress despite the two forces acting upon the second layer. In this manner, the PCB and the component are not damaged the connection (or assembly) process.

Figure 14:
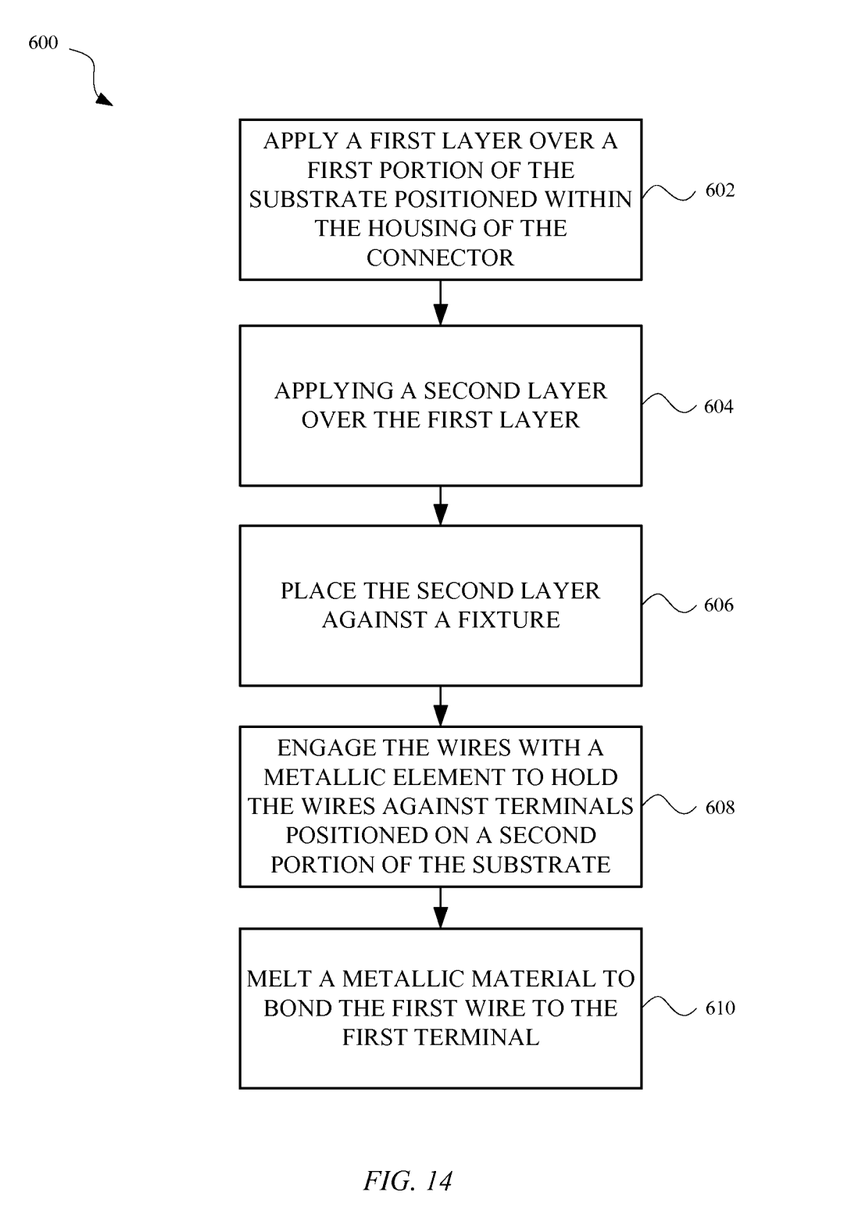
FIG. 14 illustrates a flowchart showing a method for terminating several wires of a connector to a substrate.

FIG. 14 illustrates a flowchart 600 showing a method for terminating several wires of a connector to a substrate. In step 602, a first layer is applied to a first portion of the substrate. The substrate is positioned within a housing of the connector. In some embodiments, the first layer covers several components which are electrically connected to the substrate. The components may be selected from, for example, an integrated circuit, a processor, and/or an analog circuit. In step 604, a second layer is applied over the first layer. In some embodiments, when the second layer is cured, the second layer forms a substantially level surface over the first layer. In step 606, the second layer is placed against a fixture. The fixture may be configured to hold a portion of the connector during an assembly process which includes connecting wires to the substrate. In step 608, a metallic element engages the several wires to hold the wires in against several terminals which are positioned on a second portion of the substrate. In some embodiments, the second portion is directly opposite the first portion. Also, in some embodiments, the several wires include a first wire and the several terminals include a first terminal. In step 610, the metallic element is heated to melt a metallic material such that the first wire is bonded to the first terminal. The bond includes an electrical and a mechanical bond. Also, in some embodiments, the metallic material is solder. Also, the metallic element and the fixture may impose forces on the substrate, the first layer, and the second layer. However, the second layer is capable of resisting the opposing forces and does not compress during the assembly process.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A method for forming a connector having a circuit board having a first surface comprising an electrical component and a second surface comprising a terminal configured to couple with a wire, wherein the second surface is opposite the first surface, the electrical component is located at a first location of the first surface, and the terminal is located at a second location of the second surface directly opposite the first surface, the method comprising:
   applying a first moisture sealant layer to the first surface to cover the electrical component without covering the terminal on the second surface, the first layer made from a first material and having a nonlinear outer surface; and
   applying a second layer over the first layer to form a planar outer surface parallel to the second surface without covering the terminal on the second surface, the second layer made from a second material different from and more rigid than the first material; and
   thereafter, soldering a wire to the terminal, wherein the first layer and the second layer only cover the second surface.

2. The method as recited in claim 1, wherein the electrical component is located at a first location of the first surface, and wherein the terminal is located at a second location of the second surface, the second location corresponding to the first location such that the second location is opposite the first location.

3. The method as recited in claim 1, further comprising forming a housing around the circuit board such that the housing 1) covers the first layer and the second layer, and 2) allows a portion of the circuit board to extend from the housing.

4. The method as recited in claim 1, further comprising:
   forming a first structural component coupled with the circuit board at a first end; and
   forming a second structural component coupled with the circuit board at a second end opposite the first end, wherein the first layer and the second layer are disposed between the first structural component and the second structural component.

5. A connector for use with a cable assembly having a wire, the connector at an intermediate stage of manufacture comprising:
   a substrate having a first surface and a second surface opposite the first surface;
   a terminal electrically coupled with the substrate and exposed at the first surface to enable the wire to be soldered to the terminal;
   an electrical component positioned on the second surface at a location directly opposite the terminal;
   a first layer covering the electrical component and providing a seal against moisture ingress, the first layer conforming to a topography of the electrical component to form a non-linear outer surface; and
   a second layer formed directly on the outer surface of the first layer and covering the first layer to form a planar outer surface over and parallel to the substrate second surface, the second layer comprising a rigid material.

6. The connector as recited in claim 5, wherein the substrate includes a first dimension, a second dimension, and a third dimension, the first dimension is approximately 10 millimeters, the second dimension is less than the first dimension, and the third dimension is less than the first dimension.

7. The connector as recited in claim 5, wherein the substrate comprises a printed circuit board.

8. The connector as recited in claim 7, wherein the electrical component comprises at least an integrated circuit, an analog circuit, or an authentication circuit.

9. The connector as recited in claim 5, wherein the first layer comprises acrylic and the second layer comprises polyurethane or polyamides.

10. The connector as recited in claim 5, wherein the first layer and the second layer combine to define a protective cover for an assembly operation to electrically and mechanically couple the wire with the terminal.

11. The connector as recited in claim 5, further comprising a housing that covers the terminal, the electrical component, the first layer, and the second layer.

12. The connector as recited in claim 11, further comprising a sheath member that covers the wire.

13. The connector as recited in claim 12, further comprising a shroud member may that supports the housing in a location where the sheath member engages the housing.

14. The connector as recited in claim 5, wherein the first layer and the second layer comprise only an electrically inert material.

15. A connector for a cable assembly, the connector at an intermediate stage of manufacture comprising:
   a circuit board comprising an electrical component and a pin on a first surface, and a terminal exposed at a second surface opposite the first surface;
   a wire electrically coupled with the circuit board at the terminal, wherein the pin is used by the wire to electrically couple the cable assembly with an electronic device; and a first protective coating covering the electrical component and providing a seal against moisture ingress, the first layer conforming to a topography of the electrical component to form a non-linear outer surface; and a second protective coating formed directly on the non-linear outer surface of the first layer and covering the first layer to form a planar outer surface over and parallel to the substrate first surface.

16. The connector as recited in claim 15, wherein the first protective coating comprises a potting material covering the electrical component to prevent liquid ingress to the electrical component; and the second protective coating comprises a rigid layer covering the potting material and the electrical component.

17. The connector as recited in claim 15, wherein the terminal on the second surface is directly opposite the electrical component on the first surface.

18. The connector as recited in claim 15, wherein the first and second protective coatings are disposed only on the first surface such that the terminal and wire remain uncovered by the protective coatings.

19. The connector as recited in claim 18, further comprising:

a first structural component coupled with the circuit board at a first end; and a second structural component coupled with the circuit board at a second end opposite the first end, wherein the first protective coating is disposed between the first structural component and the second structural component.

20. The connector as recited in claim 15, further comprising a housing positioned on the circuit board such that the housing covers the first protective coating, and allows a portion of the circuit board having the pin to extend from the housing.

* * * * *